US006847464B1

(12) United States Patent
Doe

(10) Patent No.: US 6,847,464 B1
(45) Date of Patent: Jan. 25, 2005

(54) MEASUREMENT OF PHOTOLITHOGRAPHIC FEATURES

(75) Inventor: Nicholas G. Doe, San Ramon, CA (US)

(73) Assignee: Zygo Corporation, Middlefield, CT (US)

( * ) Notice: Subject to any disclaimer, the term of this patent is extended or adjusted under 35 U.S.C. 154(b) by 255 days.

(21) Appl. No.: 10/211,468

(22) Filed: Aug. 2, 2002

Related U.S. Application Data

(60) Provisional application No. 60/309,589, filed on Aug. 2, 2001.

(51) Int. Cl.[7] ............................................. G01B 11/02
(52) U.S. Cl. ................... 356/636; 356/615; 250/559.24
(58) Field of Search ................................ 356/614, 615, 356/635, 636; 250/559.19, 559.2, 559.22–559.24, 559.29–559.38

(56) References Cited

U.S. PATENT DOCUMENTS

| | | | | |
|---|---|---|---|---|
| 4,835,402 A | * | 5/1989 | Guillaume | ............. 250/559.22 |
| 5,963,329 A | * | 10/1999 | Conrad et al. | .............. 356/613 |
| 6,303,253 B1 | * | 10/2001 | Lu | ................................ 430/5 |
| 6,314,212 B1 | * | 11/2001 | Womack et al. | ............ 382/286 |
| 6,633,831 B2 | * | 10/2003 | Nikoonahad et al. | ....... 702/155 |

OTHER PUBLICATIONS

Nicholas Doe et al., "Optical Proximity Effects in Sub–micron Photomask CD Metrology", 16th European Conference on Mask Technology for Integrated Circuits and Microcomponents, *SPIE Proceedings*, vol. 3996, pp. 139–154 (Feb. 2000).

* cited by examiner

*Primary Examiner*—Richard A. Rosenberger
*Assistant Examiner*—Vincent P. Barth
(74) *Attorney, Agent, or Firm*—Fish & Richardson P.C.

(57) ABSTRACT

A method for estimating a property of a selected feature on a photolithographic mask includes providing a model of an image-acquisition system. The model includes information indicative of the characteristics of the image-acquisition system. The image-acquisition system is used to obtain a measured signal representative of the selected feature. On the basis of the measured signal, and the information provided by the model, a value of the property is estimated for the selected feature.

30 Claims, 9 Drawing Sheets

| Model | Left Edge | Right Edge | Width | Width Variance |
|---|---|---|---|---|
| 50% threshold | 20.37 | 28.25 | 7.88 | |
| w=6 | 20.89 | 28.38 | 7.50 | 1.5 |
| w=7 | 20.71 | 28.11 | 7.40 | 0.4 |
| w=8 | 20.67 | 27.96 | 7.29 | -0.71 |
| w=9 | 20.70 | 27.93 | 7.23 | -1.77 |
| Final | 20.68 | 28.04 | 7.36 | |

*FIG. 5*

MEASUREMENT OF PHOTOLITHOGRAPHIC FEATURES

RELATED APPLICATIONS

This application claims the benefit of the Aug. 2, 2001 priority date of U.S. Provisional Application 60/309,589 the contents of which are herein incorporated by reference.

FIELD OF INVENTION

This invention relates to metrology, and in particular, to the measurement of photolithographic features.

BACKGROUND

In the macroscopic world, one can measure the width of a feature, for example a line, by measuring the distance between two opposing edges of that feature. One might expect that by providing a suitably powerful microscope, one could measure the width of a very small feature in much the same way. In fact, this is not the case. As a feature's width approaches the wavelength of the light used to observe it, the edge appears to lose its sharpness. Instead of a sharp edge, one observes, through the microscope, a gradual transition from a region that is clearly on one side of the edge to another region that is clearly on the other side of the edge.

No amount of focusing can correct the blurriness of the edge under these circumstances. Nor can the microscope somehow be made "better" in any meaningful way. The loss of a sharp edge arises not from some defect in the microscope but from the wave nature of light itself.

In the manufacture of integrated circuits, one often uses photolithographic masks to form features on a substrate. In an effort to pack more circuit elements into the integrated circuits, the critical dimensions of these features are made on the order of a wavelength of visible light. The masks used to make integrated circuits often have corresponding features whose critical dimensions are likewise on the order of an optical wavelength. To ensure the quality of these masks, these dimensions are verified with an optical microscopy. However, because of their small size, these features appear, in such a microscope, to have blurred edges.

SUMMARY

The invention provides for estimating a property of a feature by incorporating, into the estimate, information on the optical characteristics of the image-acquisition system used to observe that feature.

In one aspect, the invention includes providing a model of an image-acquisition system. This model includes information indicative of the characteristics thereof. The image-acquisition system is then used to obtain a measured signal representative of the selected feature. On the basis of the measured signal and the information provided by the model, a value of the property of the selected feature is then estimated.

The model can include information indicative of responses of the image-acquisition system to a plurality of features, each of the features having a different value of the property. One example of such a model is a set of model intensity profiles, each of which corresponds to a value of the property. A model can be obtained by convolving a spatial impulse response of the image-acquisition system with a spatial function representative of the value of the property. In this case, the spatial function can represent a transverse cross-section of a feature having a selected feature width.

The property whose value is to be estimated can be a feature width or a position of an edge of the feature. In some practices of the invention, two edge positions for corresponding edges of the feature are measured and the feature width is computed from the positions of the edges. Alternatively, one edge position and a feature width can be measured, and the second edge position can be obtained therefrom. An edge position can be measured by, for example, comparing the measured signal representative of the selected feature with the information indicative of responses of the image-acquisition system to a plurality of features.

Some practices of the invention include compensating for optical proximity error introduced by a feature proximate to the selected feature. This can include, for example, obtaining first and second estimates of a position of a selected edge relative to the positions of respective first and second edges; the selected edge being between the first and second edges. The first and second estimates are then averaged to obtain an estimate of the position of the selected edge.

In some practices of the invention, the average is a weighted average of the first and second estimates. A weighted average can be obtained by determining first and second distances between the selected edge and corresponding first and second edges. The first and second estimates are then weighted by amounts representative of the first and second distances respectively.

In another aspect, the invention includes a system for estimating a property of a feature on a photolithographic mask. Such a system includes an image-acquisition sub-system for obtaining an image of the selected feature, a model of the characteristics of the image-acquisition system; and a processor in communication with the model and with the image-acquisition sub-system, the processor being configured to obtain a measurement of the property on the basis of the image and the model.

In one embodiment, the model includes information indicative of responses of the image-acquisition system to a plurality of features, each of the features from the plurality of features having a different value of the property. In another embodiment, the model includes information indicative of responses of the image-acquisition system to a plurality of features, each of the features from the plurality of features having a different value of the property.

In another embodiment, the model includes a set of model intensity profiles, each of which corresponds to a value of the property. The model intensity profiles can be obtained by, for example, convolving a spatial impulse response of the image-acquisition system with a spatial function representative of the value of the property.

These and other features and advantages of the invention will be apparent from the following detailed description and the figures, in which:

BRIEF DESCRIPTION OF THE FIGURES

FIG. 5 is a table showing exemplary data derived from the measured intensity-profile of FIG. 4;

DETAILED DESCRIPTION

Figure 1:
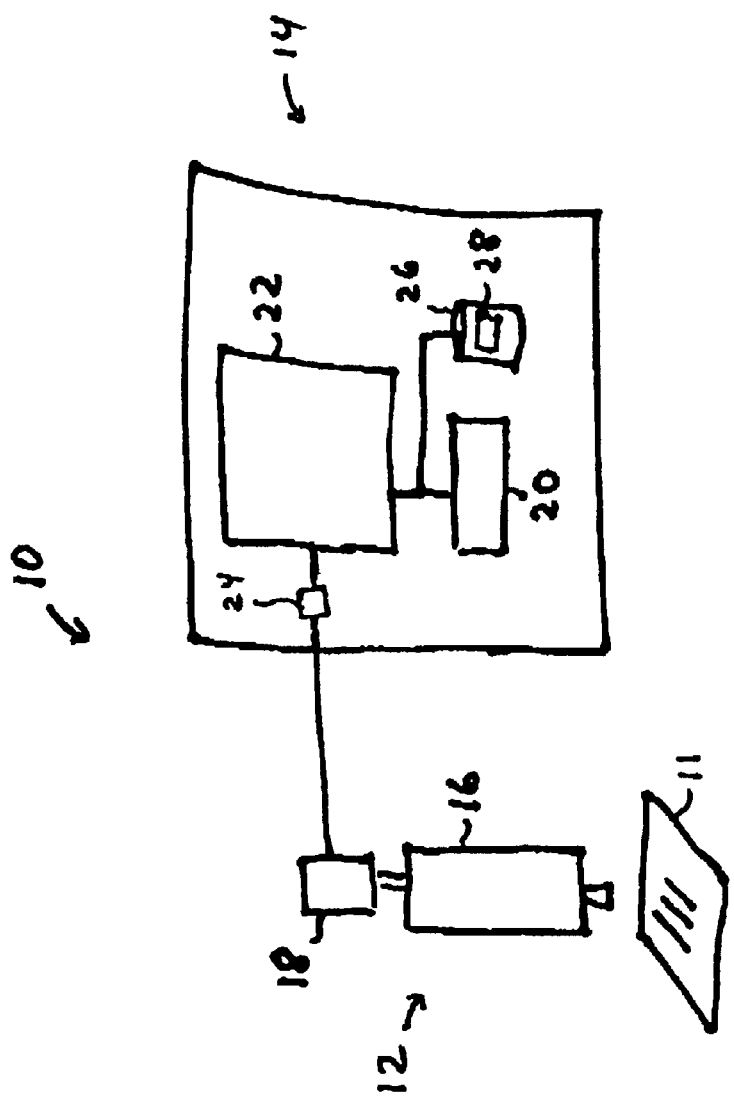
FIG. 1 is an image acquisition system.

FIG. 1 shows a system 10 for measuring the feature width of a feature on a photolithographic mask 11. The illustrated system includes an image-acquisition system 12 in communication with an image-processing system 14.

The image-acquisition system 12 includes a high-power optical microscope 16 and a CCD ("charge-coupled device") camera 18. The optical microscope 16 is disposed to view a selected feature on the mask 11. As used herein, "feature" refers to lines etched into the mask 11, the spaces between those lines, arbitrary shapes etched into the mask 11, and the regions between those arbitrary shapes. The CCD camera 18, which is in optical communication with the output of the microscope 16, generates an image signal representing the image acquired by the microscope 16 and provides that image signal to the image-processing system 14.

The image-processing system 14 includes a processor 20 in communication with a memory 22 for storage of an image acquired by the image-acquisition system 12. A frame store 24 in data communication with the camera 18 receives data from the camera 18 and provides it to the memory 22. The processor 20 executes software for estimating the width of features present in the image signal. The image-processing system 14 also maintains, on a mass-storage device 26, a database 28 containing a model of the image-acquisition system 12. This database 28 contains information indicative of the manner in which the image-acquisition system 12 distorts the image of features on the mask 11.

As a general rule, the image acquired by the image-processing system 14 does not show exactly what is on the mask 11. The extent to which the features seen on the acquired image and the features actually present on the mask 11 is approximated by the modulation transfer function of the image-acquisition system 12. The modulation transfer function is the amplitude of the spatial Fourier transform of the image-acquisition system's impulse response. Hence, an ideal image-acquisition system 12, i.e. one whose impulse response is also an impulse, would have a constant modulation transfer function.

Figure 2:
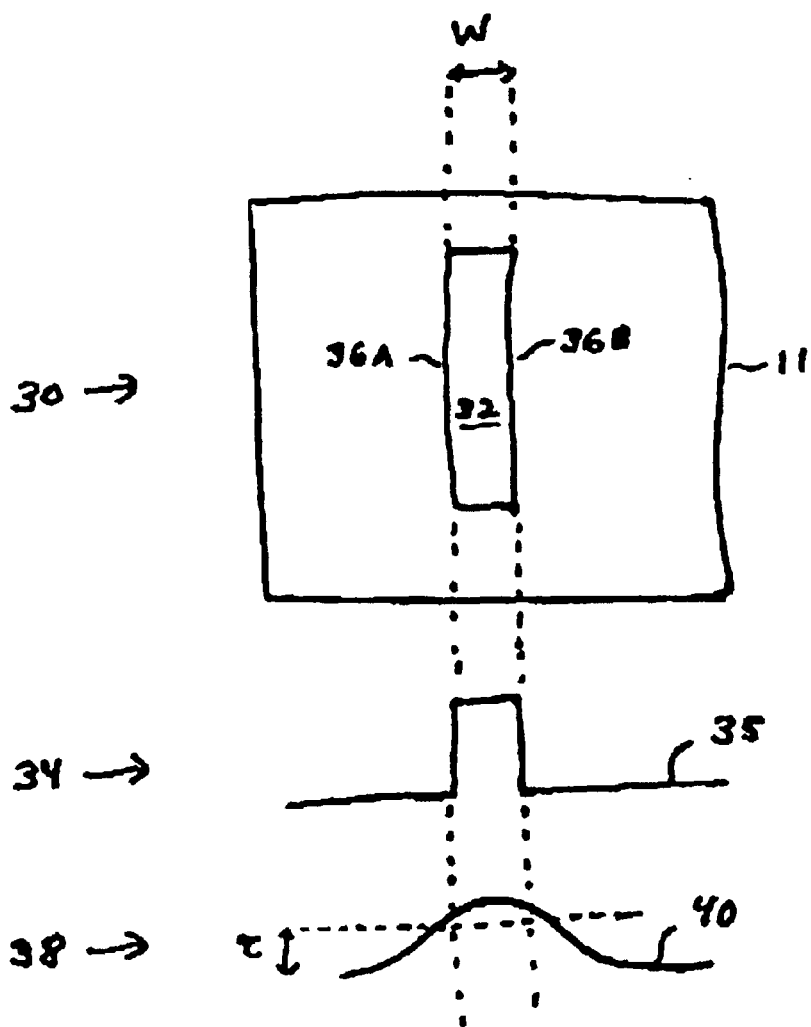
FIG. 2 compares the output of an ideal image acquisition system with that of the image acquisition system of FIG. 1.

The distortion resulting from the modulation transfer function is apparent from FIG. 2, which shows a plan view 30 of a mask 11 having a feature 32 whose width "w" is on the order of a wavelength of visible light. Underneath the plan view 30, and aligned therewith, is an idealized intensity profile 35 measured by an ideal image-acquisition system 12. Sharp discontinuities in this ideal intensity profile 35 clearly delineate the corresponding edges 36A, 36B of the feature 32. As a result, the width of the feature 32 can readily be obtained by evaluating the difference between the spatial coordinates at the discontinuities corresponding to those edges 36A, 36B.

Underneath the first cross-section 34 is a second cross-section 38 showing a measured intensity profile 40 as measured by a real image-acquisition system 12, one whose modulation transfer function is other than unity. In this measured intensity profile 40, the sharp discontinuities available in the idealized intensity profile 35 have been blurred. As a result, it is no longer possible to determine the width of the feature 32 by simply evaluating the difference between the spatial coordinates at the discontinuities.

Initial Estimate of Feature Width

One known method for estimating the locations of the edges 36A, 36B in the measured intensity profile 40 is to locate the second spatial coordinate at which the measured intensity profile 40 reaches a specified threshold value $\square$. The values of these spatial coordinates are then presumed to be the locations of the left and right edges 36A, 36B. Variations of this algorithm are those in which the specified threshold $\square$ is determined on the basis of the signal amplitude corresponding to the feature 32 whose width is sought, on the local background values, or on global values available throughout the microscope's field of view.

Another known method for estimating the width of a feature 32 is to measure the total flux of light passing through the feature 32. In the context of FIG. 2, this amounts to integrating the measured intensity profile 40 between a first and second end-point 42a, 42b. The first end-point 42a is selected to be that at which the amplitude of the measured intensity profile 40 reaches a first threshold value. This corresponds to the left edge 36A of the feature 32. As the measured intensity profile 40 is integrated beginning at this first end-point 42a, the integral will rise steeply. As the interval of integration begins to encompass more of the region near the right edge 36B of the feature 32, the value of the integral will increase progressively more slowly. The spatial coordinate at which the rate of change of the integral's value falls below a selected threshold is then considered to be the right edge 36B of the feature 32.

These and other known methods for estimating the width of a feature 32 attempt to undo the distortion introduced by the image-acquisition system 12 by carefully examining the measured intensity profile 40 measured by the image-acquisition system 12. Yet, neither of these methods actually uses the characteristics of the image-acquisition system 12 itself to undo the distortion introduced by that system 12.

Model Intensity-Profiles

Figure 3:
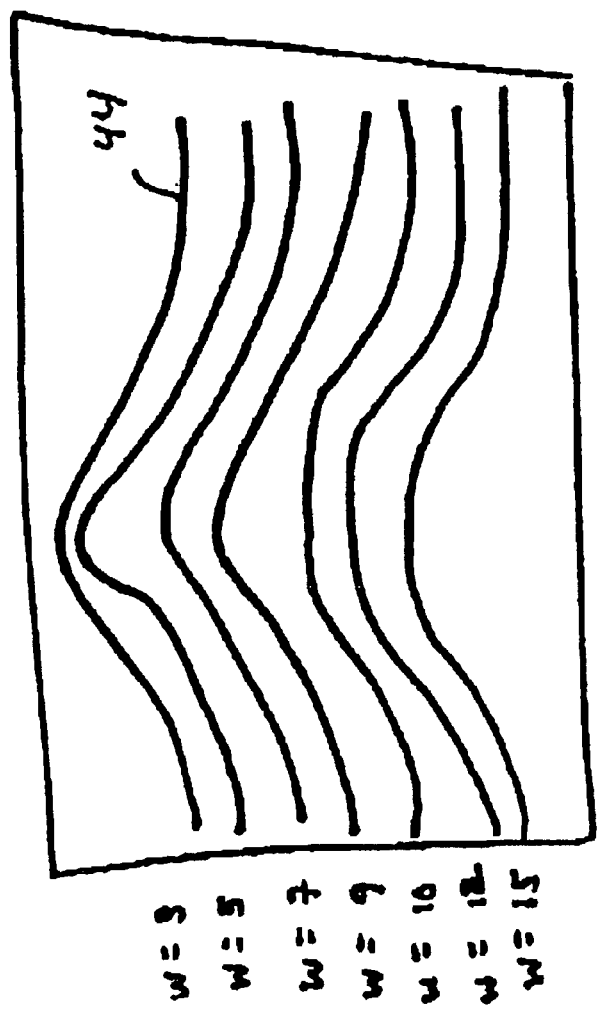
FIG. 3 is a family of model-intensity profiles corresponding to the image-acquisition system of FIG. 1.

As noted above, the image-processing system 14 maintains a database 28 that includes information indicative of the distortion introduced by the image-acquisition system 12. This database 28 features a family of model intensity-profiles 44, some of which are shown in FIG. 3. A model intensity-profile 44 represents what the image-acquisition system 12 would measure if the microscope 16 were to view a line having a particular line width. Each model intensity-profile 44 in FIG. 3 is thus associated with a particular width, which is shown on the left side of FIG. 3 beside each model intensity profile 44. The model intensity profiles 44 shown in FIG. 3 have been vertically shifted for clarity of presentation.

The model intensity-profiles 44 can be obtained by a full theoretical analysis of the image-acquisition system 12. In most cases, however, this is prohibitively complex.

Alternatively, the model intensity-profiles 44 can be obtained by using the image-acquisition system 12 to measure calibration lines of known width and to compile the resulting measured intensity-profiles into the database 28. A difficulty immediately encountered in this method is that of ensuring that the calibration lines actually have the correct widths.

Another method of obtaining the model intensity-profiles 44 is to obtain the spatial impulse response of the image-acquisition system 12. This spatial response can then be convolved with a set of spatial pulse functions, each of which has a pulse width that corresponds to a width of a calibration line. Since the convolution operation is a purely mathematical one, there is no need to actually provide real calibration lines of known width. Moreover, small errors in measuring the spatial impulse response tend to be averaged out when carrying out the convolution. The details of the algorithm are described fully in Doe et al., "*Optical proximity effects in submicron photo mask CD metrology,*" 16$^{th}$ European Conference on Mask Technology for Integrated Circuits and Microcomponents, Proc. SPIE, vol. 3996, p. 139–154, February, 2000, the contents of which are herein incorporated by reference.

Since there can only be a finite number of model intensity-profiles 44, and since there are an infinite number of possible values for the feature width w, the measured intensity-profile 40 actually obtained by the image-acquisition system 12 will usually not correspond to any one of the model intensity-profiles 44 shown in FIG. 3. As a result, the image-processing system 14 uses the model intensity-profiles 44 in FIG. 3 to interpolate the measured intensity-profile 40.

Estimating Feature Width

The image-processing system 14 begins the task of estimating the width w of a feature 32 by first obtaining an initial estimate of that width using a conventional thresholding method. On the basis of this initial estimate, the processor 20 selects a subset of the model intensity-profiles 44. The selected model intensity-profiles 44 are those that correspond to features having a width that is close to the initial estimate.

For each selected model intensity-profile 44, the processor 20 calculates the difference between the initial estimate and the width corresponding to that selected model intensity-profile 44. This quantity will hereafter be referred to as the width-variance. The calculation of a width-variance associated with each model intensity-profile 44 results in the selection of several points in a two-dimensional space, in which one coordinate is the width and the other coordinate is the width-variance.

Figure 4:
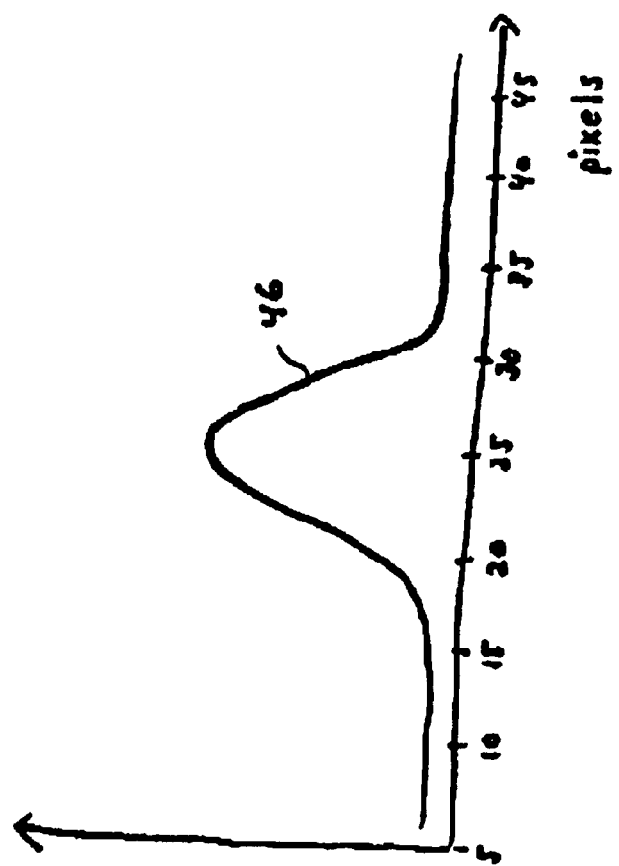
FIG. 4 is a measured intensity-profile to be compared with the model-intensity profiles of FIG. 3.

As an example, consider the measured intensity-profile 46 shown in FIG. 4. A conventional threshold method of estimating the width of the feature 32 that generated this measured intensity-profile yields an initial estimate of 7.88 pixels, with the left and right edges located at 20.37 pixels and 28.25 pixels respectively. These values form the first row 48A in the table shown in FIG. 5. The initial estimate of 7.88 pixels results in the selection, from FIG. 3, of those model intensity-profiles that correspond to features having 6, 7, 8, and 9 pixels. These values, together with the left and right edges of each of those model intensity-profiles, provide the next four rows 48B–E of the table in FIG. 5.

The width-variances corresponding to each width are shown as the last column 50E in FIG. 5. The four rows of the first and last columns 50A, 50E thus correspond to four different points in the above-mentioned two-dimensional space.

Once the points in the two-dimensional space are defined, the processor 20 obtains a width-variance function by fitting an interpolating curve through those points.

The type of interpolating curve depends, in part, on the number of available points, and hence on the number of neighboring model intensity-profiles 44 selected. In the example of FIG. 5, with four model intensity-profiles 44 having been selected, it is convenient to select, as an interpolating curve, a third order polynomial. By selecting fewer or more model intensity-profiles, different order polynomials can be used as interpolating curves. In addition, the interpolating curve need not be a polynomial at all. Finally, the processor 20 identifies that width that minimizes the width-variance function. This width becomes the final estimate of the feature width.

The width-variance function for the data shown in the table of FIG. 5 is obtained by fitting a third order polynomial to the four points defined by the first 50A and last 50E columns of the table. For the data shown in FIG. 5, the width that minimizes the resulting width-variance function is 7.36. This width represents the image processing system's final estimate of the feature width.

Estimating Edge Positions

In another practice of the invention, the model intensity-profiles 44 are used to estimate the left and right edge positions 36A, 36B of the feature 32. In this case, the feature width w is the difference between the estimated left and right edge positions of the measured intensity-profile 40 for that feature.

The image-processing system 14 begins the task of estimating the left and right edge positions of a feature 32 by first obtaining initial edge-position estimates using a conventional thresholding method. The difference between these two initial edge-position measurements provides an initial feature-width estimate. These initial estimates are all shown in the first row 48A of the table in FIG. 5.

On the basis of the initial estimate of the left and right edge positions 36A, 36B, the processor 20 selects several nearby shift values. As an example, in FIG. 5, the initial estimate for the position of the left edge 36A of the feature 32 was at 20.37 pixels. Hence, the processor 20 selected, as the nearby shift values, 18–23 pixels.

Figure 6:
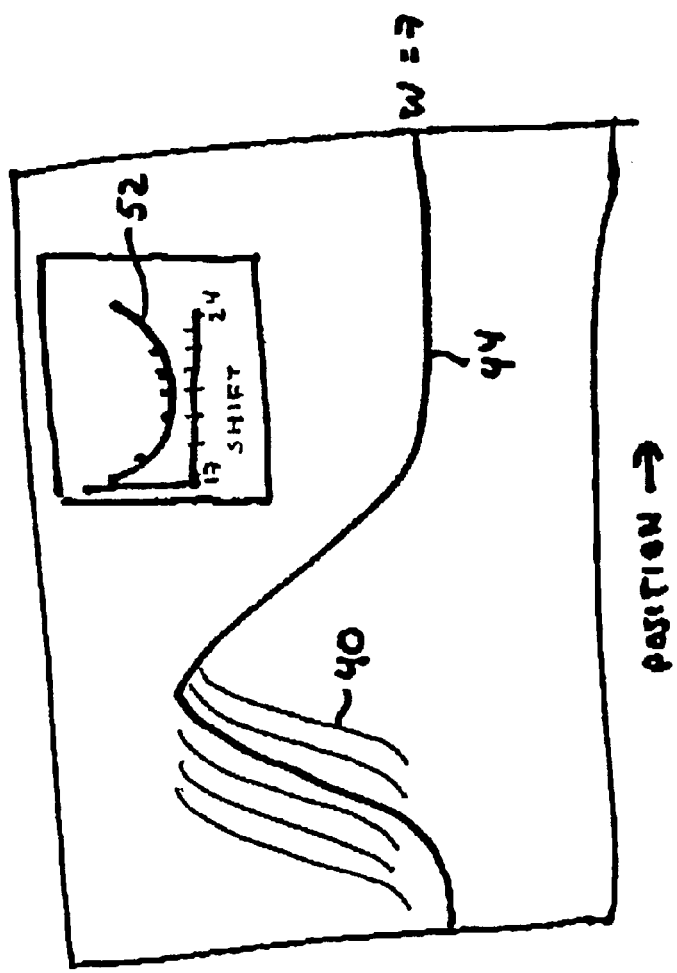
FIG. 6 is a measured intensity-profile being slid past a model intensity profile to estimate the left edge position of the measured intensity-profile.

The processor 20 then shifts each of the selected model intensity-profiles 44 against the measured intensity-profile 40 by each of the nearby shift values. For example, FIG. 6 shows the left portion of the measured intensity profile 40 being shifted relative to the model intensity-profile 44 for a 7-pixel wide feature by each of the nearby shift values from 18 through 23. A similar procedure can be carried out for the right portion of the measured intensity-profile 40.

For each of the selected nearby shift values, the processor 20 evaluates a correlation error between the measured intensity-profile 40 and the selected model intensity-profile 44. For each selected model intensity-profile 44, this results in a correlation-error curve 52 plotted against the selected nearby shift values. An example of such a correlation-error curve 52 is shown in FIG. 6 for the 7-pixel model intensity-profile 44.

In one practice of the invention, the correlation-error curve 52 is obtained by evaluating, for each point, the error $$E_{w,i} = \sum_i ((m_w M_{w,i-j} + b_w) - I_i)^2$$

where $M_w$ are the model intensity-profiles 44, $I_i$ is the measured intensity-profile 40, and $m_w$ and $b_w$ are gain and phase offsets between the measured intensity-profile 40 and the model intensity-profile 44. The gain and phase offsets reduce sensitivity to differences in illumination levels and displacement offsets between the model intensity-profiles 44 and the measured intensity-profile 40.

The minimum of the correlation-error curve 52 provides an estimate of the left edge position 36A using that measured intensity-profile 40 and that model intensity-profile 44. Using each of the model intensity profiles 44, a different estimate of the position of the left edge 36A is obtained. These estimates are listed in the second column 50B of the table in FIG. 5. Corresponding estimates for the position of the right edge 36B, obtained in the same way, are listed in the third column 50C of that table.

To obtain a final estimate of the position of the left edge 36A, the processor 20 performs an interpolation similar to that described above in connection with obtaining a final estimate of the width of a feature 32. In particular, the process 20 fits a left-edge interpolating curve to the four points defined by the second through fifth rows 48B–D of the first and second columns 50A–B of the table in FIG. 5. The resulting left-edge interpolating curve is then evaluated at the value of the initial estimate of the feature-width, which in FIG. 5 is 7.88. This results in the estimate of 20.68 pixels for the position of the left-edge 36A.

An estimate of the right-edge position 36B can be obtained in the same way. The processor 20 fits a right-edge interpolating curve to the four points defined by the second through fifth rows 48B–E of the first and third columns 50A, 50C of the table in FIG. 5. The right-edge interpolating curve is then evaluated at the value of the initial estimate of the feature-width, which in FIG. 5 is 7.88. This results in an estimate of 28.04 pixels for the position of the right-edge 36B.

Dense feature measurement

Every edge on a mask 11 is in fact common to at least two features. For example, where a mask 11, shown in FIG. 7, has a single line 54 etched into it, a first feature is the line 54 itself, a second feature is a left space 56 between a left edge 58 of the line and a left edge 60 of the mask 11, and a third feature is a right space 62 between a right edge 64 of the line and the right edge 66 of the mask 11.

In one practice of the invention, the location of a second edge of a feature is obtained by adding a measured feature-width to a measured location of a first edge of that feature. However, because every edge is common to at least two features, an ambiguity arises. For example, in FIG. 7, to determine the location of the right edge 64 of the line 54, one could consider the "feature" to be the line 54, in which case one would estimate the width of the line 54 and then add that width to an estimated position of the left edge 58. However, the "feature" could just as well be the right space 62, in which case one would estimate the width of the right space 62 and subtract that width from an estimated position of the right edge 66 of the mask 11.

Figure 7:
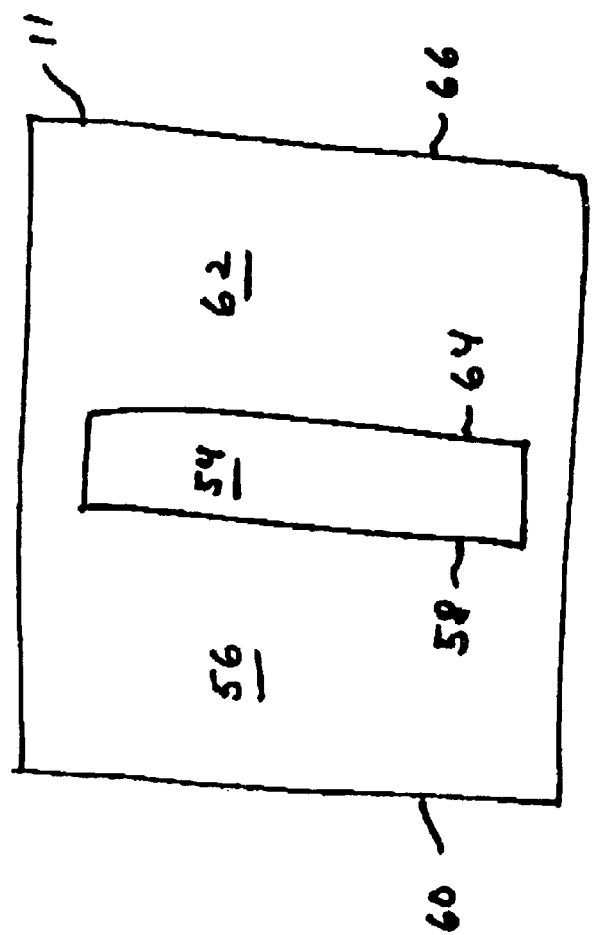
FIG. 7 shows an isolated line in a mask.

In cases such as those illustrated in FIG. 7, where the right edge 64 of the line 54 is much closer to the left edge of the line 58 than it is to the right edge 66 of the mask 11, the foregoing observation is of only academic interest. However, in a case such as that illustrated in FIG. 8, in which a great many lines are packed closely together, the proximity of neighboring edges can influence the estimate of the location of a particular edge.

Figure 8:
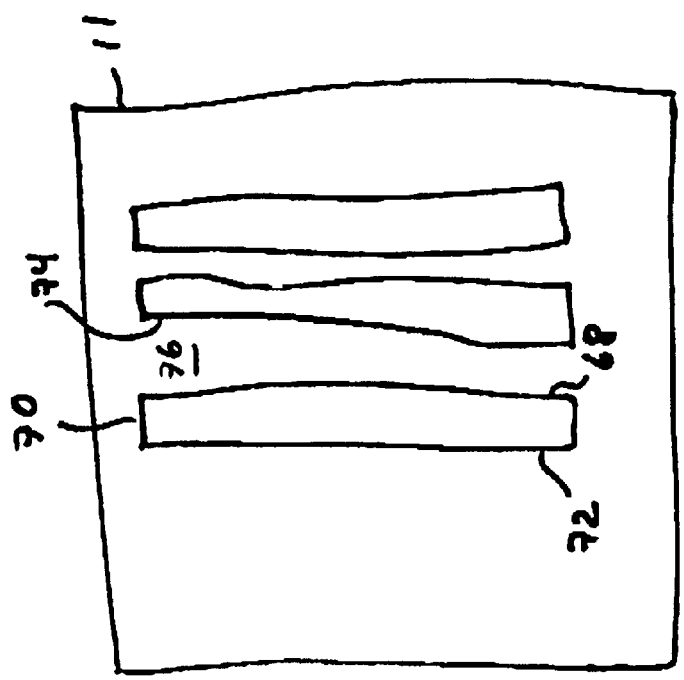
FIG. 8 shows a mask having many lines close together.

In FIG. 8, a right edge 68 of a selected line 70 is almost as close to a left edge 72 of the selected line 70 as it is to a right edge 74 of an adjacent space 76. In fact, the right edge 68 of the selected line is 70 also the left edge of the adjacent space 76. In obtaining the location of the right edge 68 of the selected line 70, one could reasonably measure the offset from either the left edge 72 of the selected line 70 or from the right edge 74 of the adjacent space 76.

It is well known that the apparent location of an edge is influenced by its proximity to other edges. To correct for this error, referred to as the "optical proximity error," one practice of the invention includes obtaining two estimates of the location of a particular edge disposed between a first and second edge.

Figure 9:
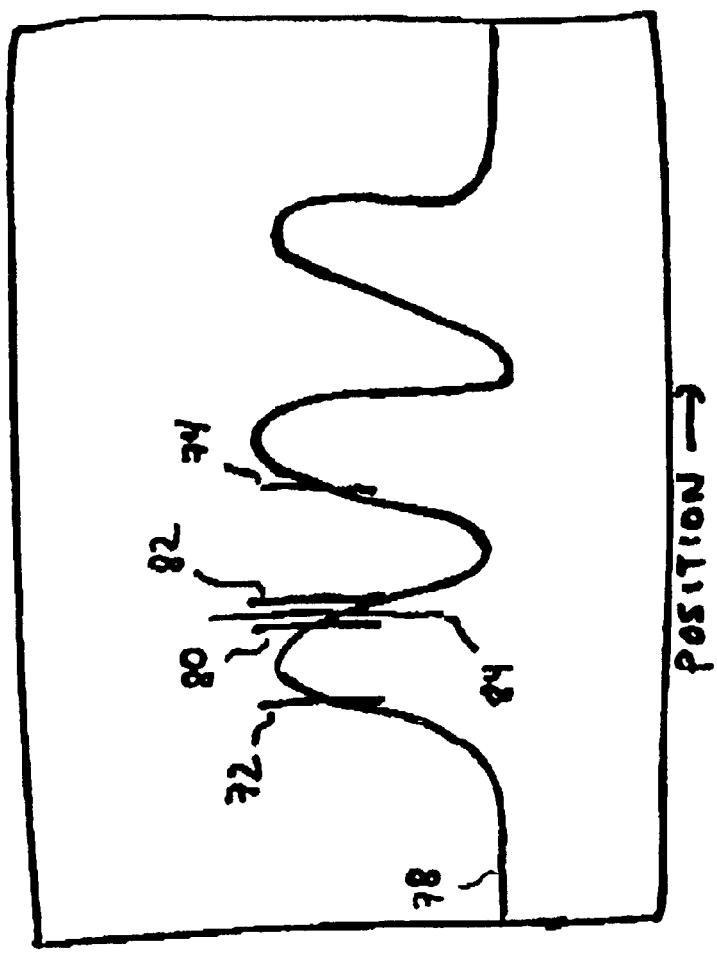
FIG. 9 shows the measured intensity-profiles corresponding to a portion of FIG. 8.

Referring to FIG. 9, which shows a measured intensity-profile 78 for a portion of the mask 11 in FIG. 8, a first estimate 80 of the position of the right edge 68 is obtained by adding a first offset to the left edge 72 of the selected line 70; a second estimate 82 of the position of the right edge 68 is obtained by subtracting a second offset from the right edge 74 of the adjacent space 76. The first and second estimates are then weighted, with the greater weight being assigned to whichever estimate is associated with the smaller offset. The final estimate 84 of the location of the right edge 68 is thus the weighted average of the first and second estimates 80, 82.

The weighting function used to assign weights to the first and second estimates is such that the first and second estimates are weighted equally when the particular edge is midway between the first and second edges. The weighting function is also selected such that when the particular edge is much closer to one edge than it is to the other edge, that other edge is effectively ignored. A suitable weighting function is:

$$x_2 = \frac{x_{12}w_{23} + x_{23}w_{12}}{w_{23} + w_{12}}$$

where $x_2$ is the final estimate of the location of the particular edge, $X_{12}$ and $X_{23}$ are the first and second estimates of that location, and $w_{12}$ and $w_{23}$ are the first and second offsets.

As described herein, the structure viewed by the image-acquisition system 12 is a photolithographic mask 11. However, the structure can be any structure having features that are to be measured. In addition, although the foregoing description refers to an optical imaging acquisition system, the procedure set forth therein does not depend on the choice of wavelength used to image a feature.

Having described the invention, and a preferred embodiment thereof, what we claim as new, and secured by Letters Patent is:

1. A method for estimating a spatial property of a selected feature on a photolithographic mask, the method comprising:

providing a model of an image-acquisition system, the model including information indicative of the characteristics of the image-acquisition system;

obtaining, with the image-acquisition system, a measured signal representative of the selected feature; and on the basis of the measured signal and the information provided by the model, estimating the value of the property of the selected feature, wherein providing a model comprises providing a set of model intensity profiles, each of the model intensity profiles corresponding to a value of the property, and providing the set of model intensity profiles comprises convolving a spatial impulse response of the image-acquisition system with a spatial function representative of the value of the property.

2. The method of claim 1, wherein providing a model comprises providing information indicative of responses of the image-acquisition system to a plurality of features, each of the features from the plurality of features having a different value of the property.

3. The method of claim 1, further comprising selecting the spatial function to represent a transverse cross-section of a feature having a selected feature width.

4. The method of claim 1, further comprising selecting the property from the group consisting of a feature width and a position of an edge of the feature.

5. The method of claim 1, wherein estimating the value of the property comprises estimating a position of a first edge of the feature.

6. The method of claim 5, wherein estimating the value of the property further comprises estimating a position of a second edge of the feature and, on the basis of the positions of the first and second edge, estimating a width of the feature.

7. The method of claim 5, wherein estimating the value of the property further comprises estimating a width of the feature, and, on the basis of the width of the feature, estimating a position of a second edge of the feature.

8. The method of claim 5, wherein estimating a position of an edge comprises comparing the measured signal representative of the selected feature with information indicative of responses of the image-acquisition system based on the model to a plurality of features.

9. The method of claim 1, wherein obtaining a measured signal representative of the selected feature comprises obtaining a measured intensity profile of the selected feature.

10. The method of claim 1, wherein estimating the value of the property comprises compensating for optical proximity error introduced by a feature proximate to the selected feature.

11. The method of claim 1, wherein estimating the value of the property comprises:

obtaining a first estimate of a position of a selected edge relative to the position of a first edge;

obtaining a second estimate of the position of the selected edge relative to the position of a second edge, the second edge being selected such that the selected edge is between the first and second edges; and averaging the first and second estimates to obtain an estimate of the position of the selected edge.

12. The method of claim 11, wherein averaging the first and second estimates comprises determining a weighted average of the first and second estimates, and setting the estimate of the position of the selected edge to be the weighted average.

13. The method of claim 12, wherein determining a weighted average of the first and second estimates comprises:

determining a first distance between the first edge and the selected edge;

determining a second distance between the second edge and the selected edge;

weighting the first estimate by an amount representative of the first distance; and weighting the second estimate by an amount representative of the second distance.

14. A system for estimating a property of a spatial feature on a photolithographic mask, the system comprising:

an image-acquisition subsystem for obtaining an image of the selected feature;

a model of the characteristics of the image-acquisition system; and a processor in communication with the model and with the image-acquisition sub-system, the processor being configured to obtain a measurement of the property on the basis of the image and the model, wherein the model comprises a set of model intensity profiles, each of the model intensity profiles corresponding to a value of the property and the set of model intensity profiles comprises a convolution of a spatial impulse response of the image-acquisition system with a spatial function representative of the value of the property.

15. The system of claim 14, wherein the model comprises information indicative of responses of the image-acquisition system to a plurality of features, each of the features from the plurality of features having a different value of the property.

16. The system of claim 14, wherein the model comprises information indicative of responses of the image-acquisition system to a plurality of features, each of the features from the plurality of features having a different value of the property.

17. The system of claim 14, wherein the image-acquisition subsystem comprises an optical microscope.

18. A computer-readable medium having encoded thereon software for estimating a spatial property of a selected feature on a photolithographic mask, the software comprising instructions for:

providing a model of an image-acquisition system, the model including information indicative of the characteristics of the image-acquisition system;

obtaining, with the image-acquisition system, a measured signal representative of the selected feature; and on the basis of the measured signal and the information provided by the model, estimating the value of the property of the selected feature, wherein the instructions for providing a model comprise instructions for providing a set of model intensity profiles, each of the model intensity profiles corresponding to a value of the property, and the instructions for providing the set of model intensity profiles comprises instructions for convolving a spatial impulse response of the image-acquisition system with a spatial function representative of the value of the property.

19. The computer-readable medium of claim 18, wherein the instructions for providing a model comprise instructions for providing information indicative of responses of the image-acquisition system to a plurality of features, each of the features from the plurality of features having a different value of the property.

20. The computer-readable medium of claim 18, wherein the software further comprises instructions for selecting the spatial function to represent a transverse cross-section of a feature having a selected feature width.

21. The computer-readable medium of claim 18, wherein the software further comprises instructions for selecting the property from the group consisting of a feature width and a position of an edge of the feature.

22. The computer-readable medium of claim 18, wherein the instructions for estimating the value of the property comprise instructions for estimating a position of a first edge of the feature.

23. The computer-readable medium of claim 22, wherein the instructions for estimating the value of the property further comprise instructions for estimating a position of a second edge of the feature and, on the basis of the positions of the first and second edge, estimating a width of the feature.

24. The computer-readable medium of claim 22, wherein the instructions for estimating the value of the property further comprise instructions for estimating a width of the feature, and, on the basis the width of the feature, estimating a position of a second edge of the feature.

25. The computer-readable medium of claim 22, wherein the instructions for estimating a position of an edge comprise instructions for comparing the measured signal representative of the selected feature with information indicative of responses of the image-acquisition system based on the model to a plurality of features.

26. The computer-readable medium of claim 18, wherein the instructions for obtaining a measured signal representative of the selected feature comprise instructions for obtaining a measured intensity profile of the selected feature.

27. The computer-readable medium of claim 18, wherein the instructions for estimating the value of the property comprise instructions for compensating for optical proximity error introduced by a feature proximate to the selected feature.

28. The computer-readable medium of claim 18, wherein the instructions for estimating the value of the property comprise instructions for:
   obtaining a first estimate of a position of a selected edge relative to the position of a first edge;
   obtaining a second estimate of the position of the selected edge relative to the position of a second edge, the second edge being selected such that the selected edge is between the first and second edges; and
   averaging the first and second estimates to obtain an estimate of the position of the selected edge.

29. The computer-readable medium of claim 28, wherein the instructions for averaging the first and second estimates comprise instructions for determining a weighted average of the first and second estimates, and setting the estimate of the position of the selected edge to be the weighted average.

30. The computer-readable medium of claim 29, wherein the instructions for determining a weighted average of the first and second estimates comprise instructions for:
   determining a first distance between the first edge and the selected edge;
   determining a second distance between the second edge and the selected edge;
   weighting the first estimate by an amount representative of the first distance; and
   weighting the second estimate by an amount representative of the second distance.

* * * * *

UNITED STATES PATENT AND TRADEMARK OFFICE
CERTIFICATE OF CORRECTION

PATENT NO. : 6,847,464 B1
DATED : January 25, 2005
INVENTOR(S) : Nicholas G. Doe It is certified that error appears in the above-identified patent and that said Letters Patent is hereby corrected as shown below:

Column 9,
Line 58, after "property" insert -- , --

Signed and Sealed this

Fifth Day of July, 2005

JON W. DUDAS
*Director of the United States Patent and Trademark Office*